US007772700B2

(12) United States Patent
Tanaka et al.

(10) Patent No.: US 7,772,700 B2
(45) Date of Patent: Aug. 10, 2010

(54) SEMICONDUCTOR DEVICE

(75) Inventors: Jun Tanaka, Kawasaki (JP); Miharu Otani, Yokohama (JP); Kiyoshi Ogata, Tokyo (JP); Yasumichi Suzuki, Yokohama (JP); Katsuhiko Hotta, Hachioji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/211,548

(22) Filed: Aug. 26, 2005

(65) Prior Publication Data

US 2006/0001167 A1   Jan. 5, 2006

Related U.S. Application Data

(62) Division of application No. 11/000,442, filed on Dec. 1, 2004, which is a division of application No. 10/411,130, filed on Apr. 11, 2003, now Pat. No. 6,838,771.

(30) Foreign Application Priority Data

Apr. 12, 2002   (JP) ............................. 2002-109901

(51) Int. Cl.
*H01L 23/48* (2006.01)
(52) U.S. Cl. ..................................... 257/758
(58) Field of Classification Search ................. 257/758, 257/508, 522, 635, 637, 750, 751, 759, 760, 257/621, E21.575, E23.145, E21.579, E21.577, 257/E21.576, E21.627, E21.641; 438/629, 438/630
See application file for complete search history.

(56) References Cited

U.S. PATENT DOCUMENTS 5,494,859 A   2/1996   Kapoor
(Continued)

FOREIGN PATENT DOCUMENTS

CN   1198002   11/1998
(Continued)

OTHER PUBLICATIONS

Jin et al., "Ultra Low κ Mesoporous Silica Films: Synthesis, Film Properties and One-Level Copper Damascene Evaluation", Materials, Technology and Reliability for Advanced Interconnects and Low-κ Dielectrics, Materials Research Society Symposium Proceedings vol. 612, Apr. 23-27, 2000, San Francisco, California, pp. D4.5. 1-8.
(Continued)

*Primary Examiner*—Dao H Nguyen
*Assistant Examiner*—Tram H Nguyen
(74) *Attorney, Agent, or Firm*—Mattingly & Malur, P.C.

(57) ABSTRACT

As etch-stop films or Cu-diffusion barrier films used in insulation films constituting conductor layers of a stacked structure, films having smaller dielectric constant than silicon nitride films are used, and an insulation film at a lower-layer part of the stacked structure is made to have smaller dielectric constant than that at an upper-layer part thereof, and further this insulation film is a silicon oxide (SiO) film and has, in the interior thereof, nano-pores of from 0.05 nm or more to 4 nm or less in diameter as chief construction. This makes it possible to dramatically reduce effective dielectric constant while keeping the mechanical strength of the conductore layers themselves, and can materialize a highly reliable and high-performance semiconductor device having mitigated the wiring delay of signals which pass through wirings.

14 Claims, 8 Drawing Sheets

U.S. PATENT DOCUMENTS

| | | | |
|---|---|---|---|
| 6,124,216 A | | 9/2000 | Ko et al. |
| 6,147,374 A * | | 11/2000 | Tanaka et al. ............... 257/295 |
| 6,187,663 B1 | | 2/2001 | Yu et al. |
| 6,218,302 B1 * | | 4/2001 | Braeckelmann et al. ..... 438/687 |
| 6,316,351 B1 | | 11/2001 | Chen et al. |
| 6,346,471 B1 * | | 2/2002 | Okushima ................... 438/622 |
| 6,358,842 B1 * | | 3/2002 | Zhou et al. ................. 438/633 |
| 6,383,913 B1 | | 5/2002 | Tsai et al. |
| 6,407,011 B1 | | 6/2002 | Ikeda et al. |
| 6,451,683 B1 | | 9/2002 | Farrar |
| 6,475,929 B1 | | 11/2002 | Gabriel et al. |
| 6,500,752 B2 | | 12/2002 | Oku et al. |
| 6,559,548 B1 | | 5/2003 | Matsunaga et al. |
| 6,576,345 B1 | | 6/2003 | Van Cleemput et al. |
| 6,633,082 B1 | | 10/2003 | Oda et al. |
| 6,670,710 B2 * | | 12/2003 | Matsunaga .................. 257/758 |
| 6,677,680 B2 | | 1/2004 | Gates et al. |
| 6,727,593 B2 * | | 4/2004 | Toyoda et al. ............... 257/762 |
| 6,812,127 B2 | | 11/2004 | Oshima et al. |
| 6,838,771 B2 | | 1/2005 | Tanaka et al. |
| 2002/0033486 A1 | | 3/2002 | Kim et al. |
| 2002/0036348 A1 * | | 3/2002 | Matsunaga et al. .......... 257/758 |
| 2002/0125577 A1 * | | 9/2002 | Komada ..................... 257/774 |
| 2002/0140064 A1 * | | 10/2002 | Wu et al. .................... 257/670 |
| 2002/0149109 A1 * | | 10/2002 | Watanabe ................... 257/758 |
| 2002/0182855 A1 | | 12/2002 | Agarwala et al. |
| 2002/0197766 A1 * | | 12/2002 | Akram et al. ............... 438/106 |
| 2003/0047794 A1 * | | 3/2003 | Watanabe ................... 257/503 |
| 2003/0064580 A1 * | | 4/2003 | Ott et al. .................... 438/633 |
| 2003/0214041 A1 * | | 11/2003 | Suzuki et al. ............... 257/758 |
| 2004/0251549 A1 * | | 12/2004 | Huang et al. ............... 257/758 |
| 2005/0093160 A1 * | | 5/2005 | Otsuka ....................... 257/758 |
| 2005/0269702 A1 * | | 12/2005 | Otsuka ....................... 257/750 |

FOREIGN PATENT DOCUMENTS

| | | |
|---|---|---|
| JP | 2-217198 | 8/1990 |
| JP | 10-335458 | 12/1998 |
| JP | 11-163127 A | 6/1999 |
| JP | 2000-269219 A | 9/2000 |
| JP | 2000-340569 | 12/2000 |
| JP | 2001-44202 A | 2/2001 |
| JP | 2001-57366 A | 2/2001 |
| JP | 2001-274239 | 10/2001 |
| JP | 2001-319928 | 11/2001 |
| JP | 2002-26121 A | 1/2002 |
| JP | 2003-163265 | 6/2003 |
| WO | WO 02/01627 | 1/2002 |
| WO | WO 02/23616 A | 3/2002 |

OTHER PUBLICATIONS

Deis et al., "Ultra Low-κ Inorganic Silsesquioxane Films with Tunable Electrical and Mechanical Properties", Materials, Technology and Reliability for Advanced Interconnects and Low-κ Dielectrics, Materials Research Society Symposium Proceedings vol. 612, Apr. 23-27, 2000, San Francisco, CA, pp. D5.18.1-6.

Jin et al., "Characterization and Integration of Porous Extra Low-κ (XLK) Dielectrics", Proceedings of the IEEE 2000 International Interconnect Technology Conference, pp. 99-101.

International Technology Roadmap for Semiconductors, 1999 Edition, pp. 163-166.

Han et al.,"Ultra Low-κ Porous Silicon Dioxide Films from a Plasma Process", Proceedings of the IEEE 2001 International Interconnect Technology Conference, pp. 171-173.

Moyer et al., "Ultra Low Dielectric Constant Silsesquioxane Based Resin", Proceedings of the IEEE 1999 International Interconnect Technology Conference, pp. 196-197.

Zhao et al., "Reliability and Electrical Properties of New Low Dielectric Constant Interlevel Dielectrics for High Performance ULSI Interconnect", 1996 IEEE International Reliability Physics, Proceedings of the 34$^{th}$ Annual Conference, Dallas, TX, Apr. 30-May 2, 1996, pp. 156-163.

Padovani et al., "Porous Methylsilsesquioxane for Low-κ Dielectric Applications", Electrochemical and Solid-State Letters, vol. 4, #11, 2001, pp. F25-F28.

* cited by examiner

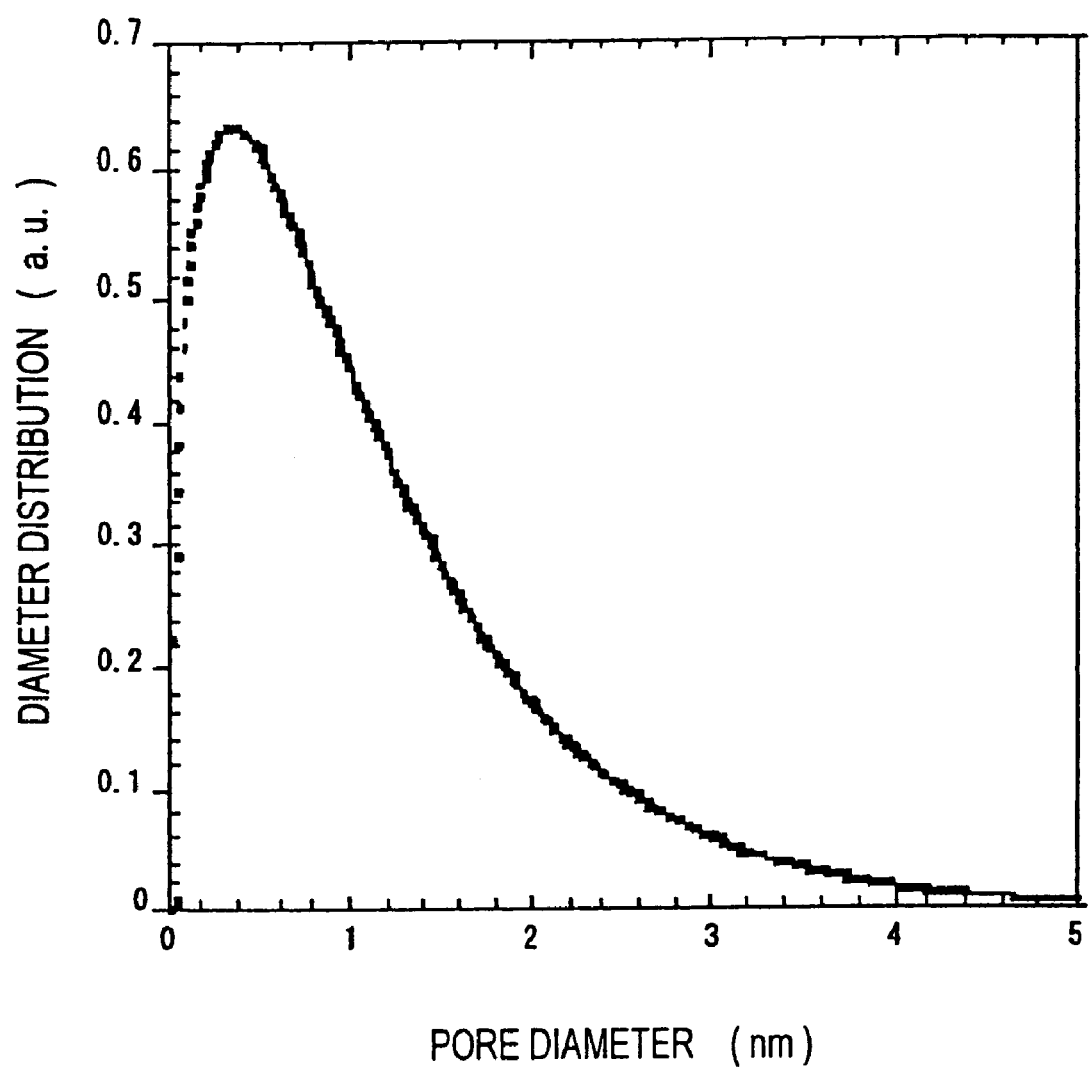

SEMICONDUCTOR DEVICE

This is a divisional application of U.S. Ser. No. 11/000,442, filed Dec. 1, 2004, which is a divisional of U.S. Ser. No. 10/411,130, filed Apr. 11, 2003, now U.S. Pat. No. 6,838,771.

BACKGROUND OF THE INVENTION

1. Field of the Invention

This invention relates to a semiconductor device in which low-dielectric-constant insulators are used as interconnecting insulation layers (interlayer insulation films) so as to mitigate any wiring delay of signals (delay in wirings of interconnection) to improve device performance.

2. Description of the Related Art

As semiconductor devices are made to have higher integration and smaller chip size, wirings are being made to scale down in length, to have narrower wiring pitches and to be formed in a larger number of metal layers (i.e., wirings are being made finer, more narrow-pitch and more multiple-layer). With such progress, the delay coming when signals pass through wirings, i.e., the wiring delay tends to increase. This is a problem of great proportions in using electronic equipment making use of semiconductor devices.

In general, the speed of signals which pass through wirings depends on the product (RC) of wiring resistance (R) and wiring-to-wiring capacitance (C). Hence, in order to mitigate the wiring delay, it is necessary to make the wiring-to-wiring capacitance small, i.e., to make the interconnecting insulation layer have a low dielectric constant.

As measures to lower the wiring resistance, it is set forward in high-performance semiconductor devices to change their wiring material from aluminum to copper. In particular, the damascene structure where copper wirings are buried in interconnecting insulation layers is actively applied in processing.

As measures to make the interconnecting insulation layer have a low dielectric constant, inorganic materials such as a silicon oxide film ($SiO_2$: dielectric constant about 4.0) and a silicon nitride film (SiN: dielectric constant about 7.0) formed by CVD (chemical vapor deposition) have conventionally been used in interconnecting insulation layers of semiconductor devices. Then, recently, these are succeeded by employment of a fluorine-doped silicon oxide film (SiOF: dielectric constant about 3.6) as a material with low dielectric constant that can continue conventional processes.

However, the fluorine-doped silicon oxide film has a relatively high dielectric constant, and can not have a sufficient effect of lessening the wiring-to-wiring capacitance when it is used as the interconnecting insulation layer. Accordingly, in semiconductor devices since the generation of wiring process of 90 nm nodes, materials having much lower dielectric constant are required.

As materials of interconnecting insulation layers having a property that the dielectric constant is lower than 3.5, various materials are proposed. In rough classification, studies are made on what is called spin-on-glass materials with which substrates are coated followed by heating to form films, on organic materials similarly formed into films, and on methods of forming films by CVD.

As the spin-on-glass materials, there are materials containing a hydrogen silsesquioxane compound, a methyl silsesquioxane compound, and the like. The materials composed chiefly of a hydrogen silsesquioxane compound or a methyl silsesquioxane compound are preferred. In the present specification, a chief ingredient is a component of the highest combination ratio (a mole ratio).

A coating solution composed chiefly of the hydrogen silsesquioxane compound is one prepared by dissolving the compound, which is represented by the general formula: ($HSiO_{3/2}$) in a solvent such as methyl isobutyl ketone. A substrate is coated with this solution, which is then subjected to intermediate heating at a temperature of approximately from 100° C. to 250° C., followed by heating at a temperature of from 350° C. to 450° C. in an inert atmosphere, e.g., in an atmosphere of nitrogen, so that an insulation layer is formed in which Si—O—Si bond networks are formed in ladder structure and which is finally chiefly composed of SiO.

A coating solution composed chiefly of the methyl silsesquioxane compound is one prepared by dissolving the compound, which is represented by the general formula: ($CH_3SiO_{3/2}$) in a solvent such as methyl isobutyl ketone. A substrate is coated with this solution, which is then subjected to intermediate heating at a temperature of approximately from 100° C. to 250° C., followed by heating at a temperature of from 350° C. to 450° C. in an inert atmosphere, e.g., in an atmosphere of nitrogen, so that an insulation layer is formed in which Si—O—Si bond networks are formed in ladder structure and which is finally chiefly composed of SiO.

As organic insulation layer materials, polymeric materials such as polyimide, poly(p-xylylene), poly(arylene) ether, poly(arylene), benzcyclobutene and polynaphthalene, which are hydrocarbon type resins, are known in the art. These materials contain carbon atoms, in virtue of which the film is made to have a low density, and also the polarizability of molecules (monomers) themselves is made small, in virtue of which the film achieves a low dielectric constant.

As methods of more reducing the dielectric constant of interconnecting insulation layers such as the above spin-on-glass films, organic films and CVD films, it is known to form nano-pores in films to make the films into porous films. With regard to the above materials and processes, they are disclosed in International Technology Roadmap for Semiconductors, 1999 Edition, pp. 163-186, and Japanese Patent Applications Laid-open No. 2000-340569 and No. 2001-274239.

However, in the above related art, the interconnecting insulation layers having the property that the dielectric constant is lower than 3.5 involve a problem that the insulation layers have fundamentally lower mechanical strength such as hardness and elastic modulus than the Silicon oxide film and Silicon nitride film formed by CVD.

In such insulation layers, it has been considered not realistic that the nano-pores are formed in films to make the films into porous films in order to more reduce the dielectric constant, because this may come toward further deterioration of mechanical strength.

As a means for lowering the dielectric constant of insulation layers, insulating organic polymers such as polyimide are used in some cases. Such organic polymers are favorable because their dielectric constant is less than 4, but have disadvantages that they physically have a lower mechanical strength and also higher hygroscopicity and moisture permeability than inorganic films. When used as interconnecting insulation layers, they may also cause a problem on the reliability of devices, e.g., a lowering of mechanical strength of device structure and corrosion of wirings which is due to absorbed moisture.

SUMMARY OF THE INVENTION

Accordingly, especially in multi-layer wiring semiconductor devices employing the damascene structure where copper wirings are filled in interconnecting insulation layers, the present inventors have made studies on how to lower the dielectric constant of the whole of interconnecting insulation layers while keeping the mechanical strength of device structure from lowering.

Under the technical background as stated above, the present invention proposes a method in which a stacked structure made up of the film with a low dielectric constant and the film with a high dielectric constant as stated above is formed and also the combination and structure of their materials are made optimum so that the achievement of both electrical properties and mechanical properties of insulation layers themselves can be materialized.

In particular, the present invention has made it possible to provide, in a semiconductor device having a stacked structure employing a damascene structure where copper wirings made to have low wiring resistance are filled in interconnecting insulation layers, a semiconductor device having highly reliable and high-performance characteristics which has mitigated the wiring delay of signals (delay in wirings of interconnection) while keeping the mechanical strength of interconnecting insulation layers from lowering.

The semiconductor device of the present invention is a semiconductor device having a substrate on which transistor elements and semiconductor circuit components have been formed, and stacked thereon a plurality of sets of conductor layers each having i) a first insulation layer, a second insulation layer and a third insulation layer and ii) a conductor wiring having been so formed as to extend through these three layers. Here, the insulation layers are so formed that the first and third insulation layers constituting each conductor layer are formed of silicon carbonitride, silicon carbide or silicon oxide, and a second insulation layer of a conductor layer positioned at a lower-layer part among the conductor layers contains silicon oxide, and a second insulation layer of a conductor layer positioned at an upper-layer part among them contains fluorine-doped silicon oxide or carbon-doped silicon oxide.

Here, where copper wiring is used as conductor wiring to serve as a component, the first insulation layer serves as an etch-stop film when insulation layers are holed in order to fill with the copper wiring. The third insulation layer also serves as a Cu-diffusion barrier film of the copper wiring.

Conventionally, silicon nitride films are used as the etch-stop film and Cu-diffusion barrier film. In the present invention, a film comprised of silicon carbonitride (Si—C—N: dielectric constant about 4.6), silicon carbide (Si—C: dielectric constant about 4.4) or silicon oxide is used, having lower dielectric constant than silicon nitride, and hence, even in the whole of conductor layers formed in multi-layer stacked structure, its dielectric constant can be reduced.

The second insulation layer of a conductor layer positioned at an upper-layer part among the conductor layers is formed of fluorine-doped silicon oxide or carbon-doped silicon oxide (dielectric constant: about 2.9). This enables more reduction of the dielectric constant of the whole of conductor layers than in a case in which all the second insulation layers constituting the corresponding conductor layers are formed of silicon oxide.

The semiconductor device of the present invention is also so constructed that the second insulation layer of a conductor layer positioned at a lower-layer part is comprised of an insulating film material having a dielectric constant of less than 3.0 and the second insulation layer of a conductor layer positioned at an upper-layer part is formed of fluorine-doped silicon oxide or carbon-doped silicon oxide. That is, the second insulation layers are made to differ in constituents between the conductor layer positioned at a lower-layer part and the conductor layer positioned at an upper-layer part so that the latter insulation layer can have a smaller dielectric constant than the former insulation layer.

The semiconductor device of the present invention is also so constructed that the second insulation layer of a conductor layer positioned at a lower-layer part is an insulation film having characteristics of a dielectric constant of less than 3.0 and containing SiO and that more than half of nano-pores present in the insulation film are chiefly comprised of pores of from 0.05 nm or more to 4 nm or less in diameter. In the present invention, as having the nano-pores in the film, the film density can be reduced, and, as making use of the insulation film having characteristics of a dielectric constant of less than 3.0 and containing SiO, the dielectric constant can be more reduced in the whole of conductor layers formed in multi-layer stacked structure.

Here, a method may be used in which the nano-pores are formed in the insulation film to lower its density and make its dielectric constant to that of vacuum. This can make the dielectric constant of the insulation film lower than the dielectric constant of the silicon oxide film.

In particular, the size and density of such nano-pores may be controlled. This enables formation of an insulation film having any desired dielectric constant.

However, the size of the nano-pores to be incorporated in the insulation film must be controlled with great care because, if the nano-pores have a large diameter, problems may instead arise such that the mechanical strength as a structure of the insulation film lowers and the leak current flows greatly through the insulation film to lower the breakdown strength that is a characteristic feature as the insulation film.

Accordingly, in the present invention, the range of pore diameter is controlled so that the mechanical strength and breakdown strength of the insulation film can be kept from lowering. Here, the nano-pores may chiefly comprise pores of from 0.05 nm or more to 4 nm or less in diameter. In such a case, a semiconductor device having high reliability can be provided without lowering the mechanical strength of the insulation film.

The insulation film having the above nano-pores is formed of an insulation film composed chiefly of SiO, obtained by heating a spin-on film composed chiefly of a hydrogen silsesquioxane compound or a methyl silsesquioxane compound.

A coating solution composed chiefly of the hydrogen silsesquioxane compound is one prepared by dissolving the compound, which is represented by the general formula: $(HSiO_{3/2})$ in a solvent such as methyl isobutyl ketone. Also, a coating solution composed chiefly of the methyl silsesquioxane compound is one prepared by dissolving the compound, which is represented by the general formula: $(CH_3SiO_{3/2})$ in a solvent such as methyl isobutyl ketone.

A substrate may be coated with any of these solutions, which is then subjected to intermediate heating at a temperature of approximately from 100° C. to 250° C., followed by heating at a temperature of from 350° C. to 450° C. in an inert atmosphere, e.g., in an atmosphere of nitrogen, so that Si—O—Si bond networks are formed in ladder structure and finally an insulation layer composed chiefly of SiO is formed.

In the insulation film composed chiefly of SiO, obtained by heating the spin-on film composed chiefly of the hydrogen silsesquioxane compound or methyl silsesquioxane compound, as a technique by which the diameter of the pores present in the insulation film is controlled, a method is available in which, e.g., a silsesquioxane compound solution is incorporated with components other than the solvent such as methyl isobutyl ketone so that the traces made upon decomposition of the main component in the film can form the pores, where the formation of pores is controlled by regulating film formation temperature to change the behavior of decomposition so that the range of pore diameter can be kept within a selective range.

As a method of coating the solution for forming the insulation film, it may include rotary coating, slit coating and printing. Then, the spin-on film thus formed is heated to form the insulation film. Hence, even where fine wirings are formed in a high density, a good step coverage can be achieved, compared with insulation films formed by CVD.

Thus, this is advantageous in that any surface steps can be settled.

To deal with silicon wafers made to have larger diameter, a large-size film formation apparatus is required when insulation films are formed by CVD, and it follows that the cost of installation has a great influence on device cost. To solve such a problem, in the present invention, the insulation film is formed by a coating-and-heating system, and hence the installation cost can vastly be reduced. Thus, a great effect can be expected such that the investment cost of manufacture lines and further the device cost can be cut down.

In the case when the insulation film is formed by CVD, an alkylsilane compound or an alkoxysilane compound is used in a source gas as a chief component, and an insulation film finally chiefly composed of SiO is formed by ECR (electron cyclotron resonance), plasma-assisted CVD or the like.

In this case also, as a technique by which the diameter of the pores present in the insulation film is controlled, a method is available in which, e.g., a component having a high thermal decomposition temperature is fed as a source gas and the film is formed with heating at 350° C. to 450° C. so that the traces made upon decomposition of the main component in the film can form the pores.

In such a technique, the component having a high thermal decomposition temperature may be selected in variety, where the behavior of decomposition can be changed by regulating film formation temperature. Thus, the formation of pores may be controlled so that the range of pore diameter can be kept within a selective range.

The semiconductor device of the present invention also has, in the element and device peripheries, a barrier layer (called a guard ring layer in the present specification) comprised of a material capable of forming conductor wiring, in such a way that it encloses the element and device peripheries in order to prevent moisture absorption and moisture permeation from the surroundings of the semiconductor device. This can obstruct any water content which may come from the element surroundings or from the interface between the substrate and the interconnecting insulation layer, permeating through the interior of the interconnecting insulation layer.

BRIEF DESCRIPTION OF THE DRAWINGS

These and other features, objects and advantages of the present invention will become more apparent from the following description when taken in conjunction with the accompanying drawings wherein:

FIG. 4 is a graph showing diameter distribution of pores present in the insulation film.

DESCRIPTION OF THE PREFERRED EMBODIMENTS

Embodiments of the present invention are described below with reference to the accompanying drawings.

First Example

Figure 1:
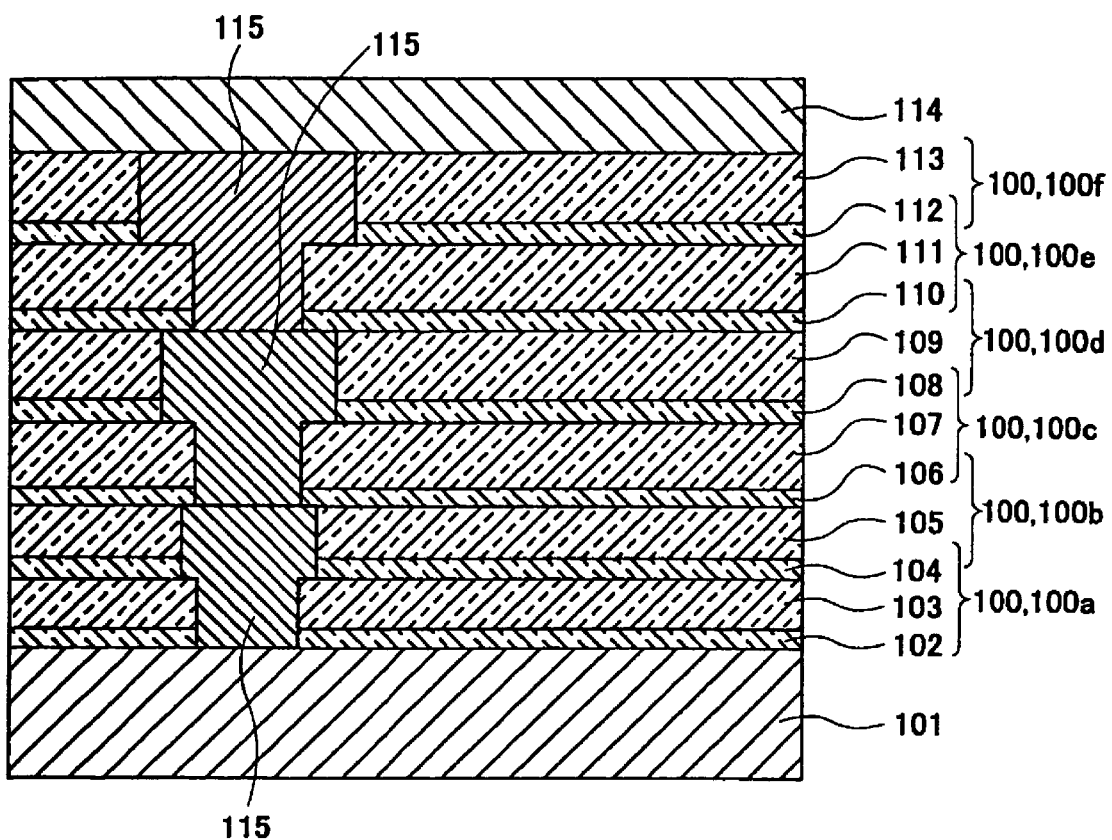
FIG. 1 is a cross-sectional view of a semiconductor device having a stacked structure created in First Example of the present invention.

In the First Example, as shown in FIG. 1, a six-layer wiring semiconductor device of Cu-wiring dual-damascene structure having six conductor layers 100 is produced.

On a semiconductor substrate 101 on which constituent elements such as MOS transistors (not shown) were formed by a commonly well known method, a silicon carbonitride film 102 serving as a first insulation layer of a first conductor layer 100a was formed by CVD in a thickness of 40 nm. This first insulation layer serves as an etch-stop film when a hole is formed for forming a wiring pattern.

Next, a silicon oxide film 103 serving as a second insulation layer of the first conductor layer 100a was formed by CVD in a thickness of 400 nm.

Next, a silicon carbonitride film 104 serving as a third insulation layer of the first conductor layer 100a was formed by CVD in a thickness of 40 nm. This film serves as a first insulation layer of a second conductor layer 100a, and plays a role also as an etch-stop film or Cu-diffusion barrier film when a hole is formed for forming a wiring pattern.

Figure 2A:
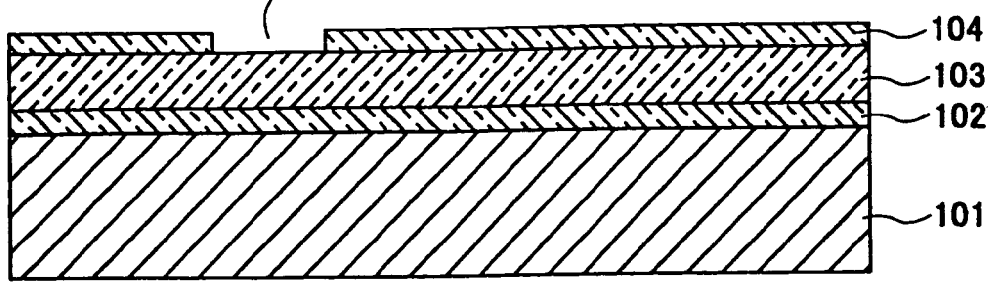
FIGS. 2A to 2D show a flow sheet for illustrating how to produce the semiconductor device of First Example.

Next, a hole 117 was formed in the silicon carbonitride film 104. The hole was formed using a photoresist and by forming a resist pattern by a known technique, followed by dry etching using the resist as a mask and using an etching gas capable of removing the silicon carbonitride film (FIG. 2A). Here, the hole is in a wiring size of the first conductor layer 100a.

Next, in the same manner as the formation of the insulation layers of the first conductor layer 100a, a silicon oxide film 105 serving as a second insulation layer of the second conductor layer 100a was formed in a thickness of 400 nm, and a silicon carbonitride film 106 serving as a third insulation layer in a thickness of 40 nm.

Figure 2B:
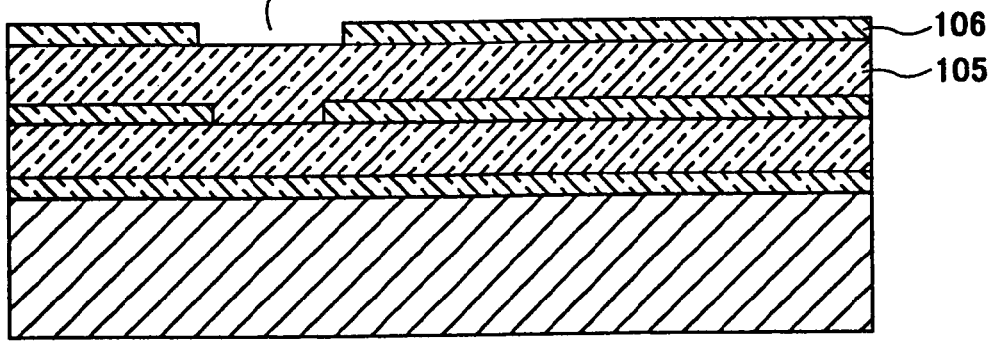

Next, a hole 118 was formed in the silicon carbonitride film 106 (FIG. 2B). The hole was formed using a photoresist and by forming a resist pattern by a known technique, followed by dry etching using the resist as a mask and using an etching gas capable of removing the silicon carbonitride film.

Next, using the silicon carbonitride film 106 as a mask, a hole was formed in the silicon oxide film 105 by dry etching using a CF type gas capable of removing the silicon oxide film. Thus, at its lower part, the silicon oxide film 103 was uncovered through the hole 117 of the silicon carbonitride film 104.

Subsequently, using the silicon carbonitride film 104 as a mask, a hole was formed in the silicon oxide film 103 through the former's hole 117. Thus, at its lower part, the silicon carbonitride film 102 was uncovered.

Figure 2C:
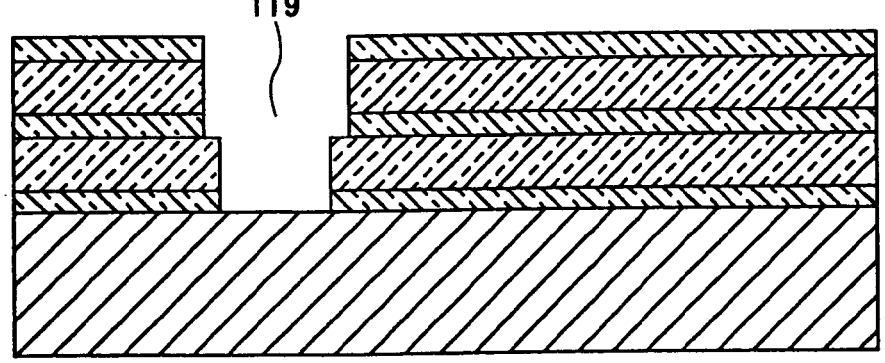

Subsequently, the etching gas was changed for one capable of removing the silicon carbonitride film 102, and then, using the silicon oxide film 103 as a mask, the silicon carbonitride film 102 was removed by dry etching through the former's hole to form a hole extending therethrough to reach the semiconductor substrate 101. Here, the periphery of the hole 117 of the silicon carbonitride film 104 was also etched to make the hole 117 expand to the same size as the hole 118 of the uppermost silicon carbonitride film 106. Thus, a wiring trench 119 was formed which extended through the layers to reach the semiconductor substrate 101 (FIG. 2C).

Next, a barrier metal layer 120 was formed on the inner surfaces of the wiring trench 119, and thereafter the wiring trench 119 was filled with Cu 121 by well known plating. As the barrier metal, TiN was used in this Example.

Then, any unnecessary Cu film present on the uppermost silicon carbonitride film 106 was removed and the surface was cleaned to form a connecting plug and a wiring at the same time. To remove the Cu film, it is advantageous to use alumina or silica as abrasive grains and employ chemical mechanical polishing making use of an abrasive comprised of additives such as a Cu complexing agent and a surface-active agent.

Figure 2D:
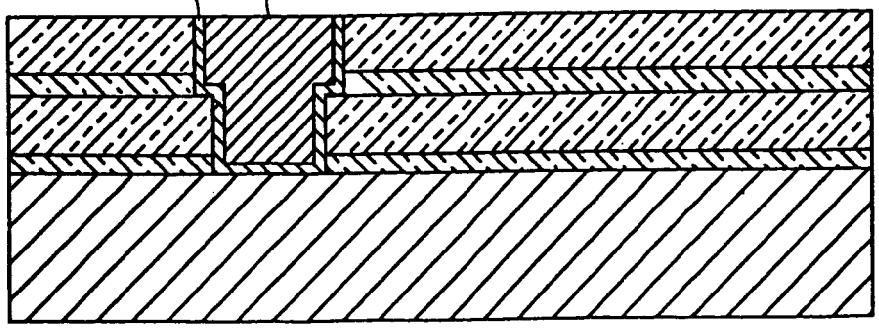

In this polishing step, the silicon carbonitride film 106 corresponding to the uppermost layer was also removed by polishing. Thus, a dual-damascene structure in which a Cu wiring (inclusive of 120 and 121) was formed was produced. (FIG. 2D)

Subsequently, the same process as the above was repeated twice to form a third conductor layer 100c—a sixth conductor layer 100f, and a six-layer Cu wiring structure is obtained. Here, insulation layers 106, 108, 110 and 112 are formed of silicon carbonitride films formed by CVD, and insulation layers 107 and 109 are formed of silicon oxide films. Also, insulation layers 111 and 113 are formed of fluorine-doped silicon oxide films.

Next, a silicon nitride film 114 was formed as the uppermost layer to produce a multi-layer wiring semiconductor device made up of a six-layer Cu wiring 115 (FIG. 1).

Thus, a high-performance semiconductor device was obtained the dielectric constant of the whole of interconnecting insulation layers of which was lowered in virtue of the use of, as the etch-stop films or Cu-diffusion barrier films, the silicon carbonitride films having lower dielectric constant than silicon nitride films and also in virtue of the use of, in the upper-layer part of the multi-layer stacked structure, the fluorine-doped silicon oxide films having smaller dielectric constant than silicon oxide films.

Second Example

In this Example, using the same techniques as those in First Example, fluorine-doped silicon oxide films (SiOF films) were formed by CVD also in respect of the insulation layers 107 and 109. Next, the silicon nitride film 114 was formed as the uppermost layer to produce a multi-layer wiring semiconductor device made up of a six-layer Cu wiring 115.

Thus, a high-performance semiconductor device was obtained the dielectric constant of the whole of interconnecting insulation layers of which was lowered in virtue of the use of, as the etch-stop films or Cu-diffusion barrier films, the silicon carbonitride films having lower dielectric constant than silicon nitride films and also in virtue of the use of, in the ⅓ (from the bottom) or more upper-layer part of the multi-layer stacked structure, the fluorine-doped silicon oxide films having smaller dielectric constant than silicon oxide films.

Third Example

In this Example, using the same techniques as those in First Example, silicon carbide films were formed by CVD in respect of the insulation layers 102, 104, 106, 108, 110 and 112. Next, the silicon nitride film 114 was formed as the uppermost layer to produce a multi-layer wiring semiconductor device made up of a six-layer Cu wiring 115.

Thus, a high-performance semiconductor device was obtained the dielectric constant of the whole of interconnecting insulation layers of which was lowered in virtue of the use of, as the etch-stop films or Cu-diffusion barrier films, the silicon carbide films having lower dielectric constant than silicon nitride films.

Fourth Example

In this Example, using the same techniques as those in Second Example, silicon carbide films (SiC films) were formed by CVD in respect of the insulation layers 102, 104, 106, 108, 110 and 112. Next, the silicon nitride film 114 was formed as the uppermost layer to produce a multi-layer wiring semiconductor device made up of a six-layer Cu wiring 115.

Thus, a high-performance semiconductor device was obtained the dielectric constant of the whole of interconnecting insulation layers of which was lowered in virtue of the use of, as the etch-stop films or Cu-diffusion barrier films, the silicon carbide films having lower dielectric constant than silicon nitride films.

Fifth Example

In this Example, using the same techniques as those in First Example, carbon-doped silicon oxide films were formed by CVD also in respect of the insulation layers 111 and 113 to produce a multi-layer wiring semiconductor device made up of a six-layer Cu wiring 115.

Thus, a high-performance semiconductor device was obtained the dielectric constant of the whole of interconnecting insulation layers of which was lowered in virtue of the use of, in the upper-layer part of the multi-layer stacked structure, the carbon-doped silicon oxide films having smaller dielectric constant than silicon oxide films.

Sixth Example

In this Example, using the same techniques as those in Second Example, carbon-doped silicon oxide films were formed by CVD also in respect of the insulation layers 107, 109, 111 and 113 to produce a multi-layer wiring semiconductor device made up of a six-layer Cu wiring 115.

Thus, a high-performance semiconductor device was obtained the dielectric constant of the whole of interconnecting insulation layers of which was lowered in virtue of the use of, in the ⅓ (from the bottom) or more upper-layer part of the multi-layer stacked structure, the carbon-doped silicon oxide films having smaller dielectric constant than silicon oxide films.

Seventh Example

In this Example, using the same techniques as those in Fifth Example, silicon carbide films (SiC films) were formed by CVD in respect of the insulation layers 102, 104, 106, 108, 110 and 112. Next, the silicon nitride film 114 was formed as the uppermost layer to produce a multi-layer wiring semiconductor device made up of a six-layer Cu wiring 115.

Thus, a high-performance semiconductor device was obtained the dielectric constant of the whole of interconnecting insulation layers of which was lowered in virtue of the use of, as the etch-stop films or Cu-diffusion barrier films, the silicon carbide films having lower dielectric constant than silicon nitride films.

Eighth Example

In this Example, using the same techniques as those in Sixth Example, silicon carbide films were formed by CVD in respect of the insulation layers 102, 104, 106, 108, 110 and 112. Next, the silicon nitride film 114 was formed as the uppermost layer to produce a multi-layer wiring semiconductor device made up of a six-layer Cu wiring 115.

Thus, a high-performance semiconductor device was obtained the dielectric constant of the whole of interconnecting insulation layers of which was lowered in virtue of the use of, as the etch-stop films or Cu-diffusion barrier films, the silicon carbide films having lower dielectric constant than silicon nitride films.

Ninth Example

In this Example, using the same techniques as those in First Example, carbon-doped silicon oxide films were formed by CVD in respect of the insulation layers 103, 105, 107 and 109 to produce a multi-layer wiring semiconductor device made up of a six-layer Cu wiring 115.

Thus, a high-performance semiconductor device was obtained the dielectric constant of the whole of interconnecting insulation layers of which was lowered in virtue of the use of, in the lower-layer part of the multi-layer stacked structure, as the insulation films the carbon-doped silicon oxide films having small dielectric constant and also in virtue of the use of, in the upper-layer part of the multi-layer stacked structure, the fluorine-doped silicon oxide films having smaller dielectric constant than silicon oxide films.

Tenth Example

In this Example, using the same techniques as those in Second Example, carbon-doped silicon oxide films were formed by CVD in respect of the insulation layers 103 and 105 to produce a multi-layer wiring semiconductor device made up of a six-layer Cu wiring 115.

Thus, a high-performance semiconductor device was obtained the dielectric constant of the whole of interconnecting insulation layers of which was lowered in virtue of the use of, in the lower-layer part of the multi-layer stacked structure, as the insulation films the carbon-doped silicon oxide films having small dielectric constant and also in virtue of the use of, in the ⅓ (from the bottom) or more upper-layer part of the multi-layer stacked structure, the fluorine-doped silicon oxide films having smaller dielectric constant than silicon oxide films.

Eleventh Example

In this Example, using the same techniques as those in Third Example, carbon-doped silicon oxide films were formed by CVD in respect of the insulation layers 103, 105, 107 and 109 to produce a multi-layer wiring semiconductor device made up of a six-layer Cu wiring 115.

Thus, a high-performance semiconductor device was obtained the dielectric constant of the whole of interconnecting insulation layers of which was lowered in virtue of the use of, in the lower-layer part of the multi-layer stacked structure, as the insulation films the carbon-doped silicon oxide films having small dielectric constant, and also in virtue of the use of, in the upper-layer part of the multi-layer stacked structure, the fluorine-doped silicon oxide films having smaller dielectric constant than silicon oxide films and the use of, as the etch-stop films or Cu-diffusion barrier films, the silicon carbide films having lower dielectric constant than silicon nitride films.

Twelfth Example

In this Example, using the same techniques as those in Fourth Example, carbon-doped silicon oxide films were formed by CVD in respect of the insulation layers 103 and 105 to produce a multi-layer wiring semiconductor device made up of a six-layer Cu wiring 115.

Thus, a high-performance semiconductor device was obtained the dielectric constant of the whole of interconnecting insulation layers of which was lowered in virtue of the use of, in the lower-layer part of the multi-layer stacked structure, the carbon-doped silicon oxide films having small dielectric constant, and also in virtue of the use of, in the ⅓ (from the bottom) or more upper-layer part of the multi-layer stacked structure, the fluorine-doped silicon oxide films having smaller dielectric constant than silicon oxide films and the use of, as the etch-stop films or Cu-diffusion barrier films, the silicon carbide films having lower dielectric constant than silicon nitride films.

Thirteenth Example

In this Example, using the same techniques as those in First Example, in respect of the insulation layers 103, 105, 107 and 109, spin-on films of a methyl isobutyl ketone solution composed chiefly of the hydrogen silsesquioxane compound were formed on the substrate, and thereafter heated at 100° C. for 10 minutes and then at 150° C. for 10 minutes and further at 230° C. for 10 minutes in an atmosphere of nitrogen by means of a hot plate.

Then, the films were further heated at 350° C. for 30 minutes in an atmosphere of nitrogen by means of a furnace to form insulation films in which Si—O—Si bond networks were formed in ladder structure and which were finally chiefly composed of SiO and had the pore-formation-controlled nano-pores in films. Thus, a multi-layer wiring semiconductor device made up of a six-layer Cu wiring 115 was produced. The holes were formed by dry etching using a CF type gas capable of etching SiO.

Figure 3:
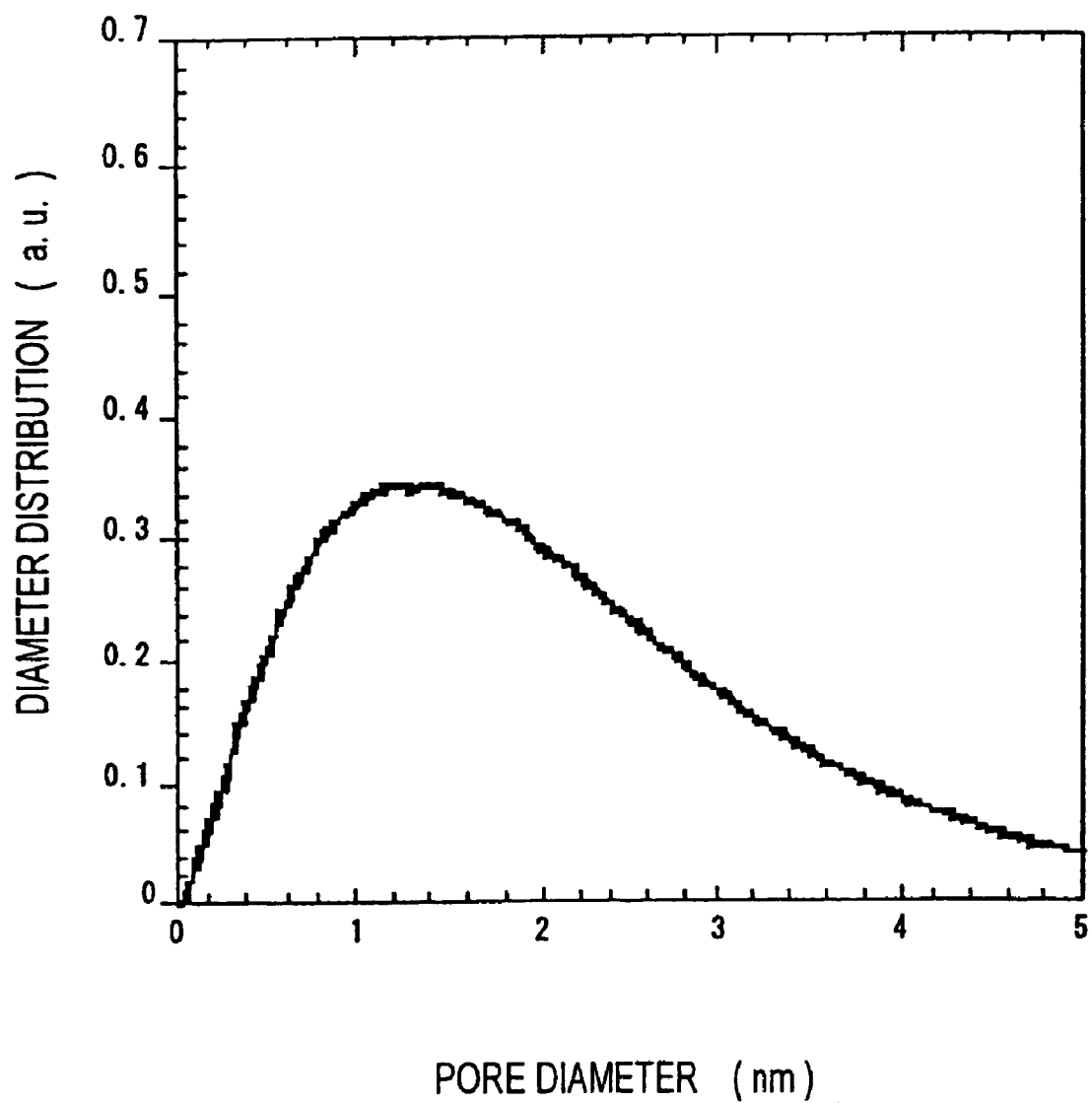
FIG. 3 is a graph showing diameter distribution of pores present in the insulation film.

In the case of this Example, the above insulation layers are insulation films in which nano-pores having distribution characteristics (diameter distribution) as shown in FIG. 3, chiefly containing pores of from 0.05 nm or more to 4 nm or less in diameter, are present, having dielectric constant of about 2.3.

The diameter distribution is determined by calculating diameter distribution of scattering matter in comparison with theoretical scattering intensity based on scattering functions which assume spherical scattering matter, on the basis of X-ray reflection measurement data and X-ray diffuse scattering measurement data which are obtained using an X-ray diffractometer for thin film evaluation (model: ATX-G) manufactured by Rigaku Corporation.

The above insulation films having the nano-pores in films also have characteristics of a Young's modulus of 12 Ga. For these characteristics, in respect of like films of 250 nm in layer thickness which have been formed on silicon wafers, the hardness of the films is determined on the basis of the hardness at a surface layer point of 1/5 of the total layer thickness, by indentation micromechanical testing making use of Nano Indenter XP, manufactured by MTS Systems Corporation in U.S.A.

The Young's modulus is also the value at the surface layer point of 1/5 of the total layer thickness and is the value calculated on the basis of the Poisson's ratio 0.17 of molten quartz. A siliconoxide film deposited with p-TEOS (plasma-Tetra-Ethly-Urtho-Silicate) called p-TEOS film in the present specification having substantially the same layer thickness and whose Young's modulus has been determined by the same method has characteristics of a Young's modulus of 70 Ga.

From the foregoing, the insulation films having the nano-pores in films were films having a Young's modulus of about 17% of that of the p-TEOS film, and low-dielectric-constant insulation films having superior mechanical properties were obtained, compared with low-dielectric-constant insulation films disclosed in Japanese Patent Application Laid-open No. 2000-340569.

Thus, a high-performance semiconductor device was obtained the dielectric constant of the whole of interconnecting insulation layers of which was lowered, keeping the mechanical strength of element structure from lowering, in virtue of the use of, in the lower-layer part of the multi-layer stacked structure, the insulation films having dielectric constant of less than 2.5 and superior film strength and also in virtue of the use of, in the upper-layer part of the multi-layer stacked structure, the fluorine-doped silicon oxide films having smaller dielectric constant than silicon oxide films.

Fourteenth Example

In this Example, using the same techniques as those in Thirteenth Example, silicon carbide films were formed by CVD in respect of the insulation layers 102, 104, 106, 108, 110 and 112. Next, the silicon nitride film 114 was formed as the uppermost layer to produce a multi-layer wiring semiconductor device made up of a six-layer Cu wiring 115.

Thus, low-dielectric-constant insulation films having superior mechanical properties were obtained in virtue of the use of, as the etch-stop films or Cu-diffusion barrier films, the silicon carbide films having lower dielectric constant than silicon nitride films and also in virtue of the use of the insulation films having the nano-pores in films, specifying their pore diameter.

Then, a high-performance semiconductor device was further obtained the dielectric constant of the whole of interconnecting insulation layers of which was lowered, keeping the mechanical strength of element structure from lowering, in virtue of the use of, in the lower-layer part of the multi-layer stacked structure, as the second insulation layers the insulation films having dielectric constant of less than 2.5 and superior film strength and also in virtue of the use of, in the upper-layer part of the multi-layer stacked structure, the fluorine-doped silicon oxide films having smaller dielectric constant than silicon oxide films.

Fifteenth Example

In this Example, using the same techniques as those in Thirteenth Example, in respect of the insulation layers 103, 105, 107 and 109, spin-on films of a methyl isobutyl ketone solution composed chiefly of the hydrogen silsesquioxane compound were formed on the substrate, and thereafter heated at 100° C. for 10 minutes and then at 150° C. for 10 minutes and further at 230° C. for 10 minutes in an atmosphere of nitrogen by means of a hot plate.

Then, the films were further heated at 350° C. for 30 minutes in an atmosphere of nitrogen by means of a furnace to form insulation films in which Si—O—Si bond networks were formed in ladder structure and which were finally chiefly composed of SiO and had the pore-formation-controlled nano-pores in films. Thus, a multi-layer wiring semiconductor device made up of a six-layer Cu wiring 115 was produced. The holes were formed by dry etching using a gas capable of etching SiO.

In the case of this Example, the above insulation layers are insulation films in which nano-pores having distribution characteristics (diameter distribution) as shown in FIG. 3, chiefly containing pores of from 0.05 nm or more to 4 nm or less in diameter, are present, having dielectric constant of about 2.7.

The diameter distribution is determined by calculating diameter distribution of scattering matter in comparison with theoretical scattering intensity based on scattering functions which assume spherical scattering matter, on the basis of X-ray reflection measurement data and X-ray diffuse scattering measurement data which are obtained using an X-ray diffractometer for thin film evaluation (model: ATX-G) manufactured by Rigaku International Corporation.

The above insulation films having the nano-pores in films also have characteristics of a Young's modulus of 11 Ga. For these characteristics, in respect of like films of 250 nm in layer thickness which have been formed on silicon wafers, the hardness of the films is determined on the basis of the hardness at a surface layer point of 1/5 of the total layer thickness, by indentation micromechanical testing making use of Nano Indenter XP, manufactured by MTS Systems Corporation in U.S.A. The Young's modulus is also the value at the surface layer point of 1/5 of the total layer thickness and is the value calculated on the basis of the Poisson's ratio 0.17 of molten quartz. A p-TEOS film having substantially the same layer thickness and whose Young's modulus has been determined by the same method has characteristics of a Young's modulus of 70 Ga.

From the foregoing, the insulation films having the nano-pores in films were films having a Young's modulus of about 16% of that of the p-TEOS film, and low-dielectric-constant insulation films having superior mechanical properties were obtained, compared with low-dielectric-constant insulation films disclosed in Japanese Patent Application Laid-open No. 2000-340569.

Thus, a high-performance semiconductor device was obtained the dielectric constant of the whole of interconnecting insulation layers of which was lowered, keeping the mechanical strength of element structure from lowering, in virtue of the use of, in the lower-layer part of the multi-layer stacked structure, as the second insulation layers the insulation films having dielectric constant of less than 3.0 and superior film strength and also in virtue of the use of, in the upper-layer part of the multi-layer stacked structure, the fluorine-doped silicon oxide films having smaller dielectric constant than silicon oxide films.

Sixteenth Example

In this Example, using the same techniques as those in Fifteenth Example, silicon carbide films were formed by CVD in respect of the insulation layers 102, 104, 106, 108, 110 and 112. Next, the silicon nitride film 114 was formed as the uppermost layer to produce a multi-layer wiring semiconductor device made up of a six-layer Cu wiring 115.

Thus, low-dielectric-constant insulation films having superior mechanical properties were obtained in virtue of the use of, as the etch-stop films or Cu-diffusion barrier films, the silicon carbide films having lower dielectric constant than silicon nitride films and also in virtue of the use of the insulation films having the nano-pores in films, specifying their pore diameter. Then, a high-performance semiconductor device was further obtained the dielectric constant of the whole of interconnecting insulation layers of which was lowered, keeping the mechanical strength of element structure from lowering, in virtue of the use of, in the lower-layer part of the multi-layer stacked structure, as the second insulation layers the insulation films having dielectric constant of less than 2.5 and superior film strength and also in virtue of the use of, in the upper-layer part of the multi-layer stacked structure, the fluorine-doped silicon oxide films having smaller dielectric constant than silicon oxide films.

Seventeenth Example

Seventeenth Example is an example in which the present invention is applied in forming Cu-wiring dual-damascene structure, and is described with reference to the FIGS. 5A to 5D flow sheet.

On a semiconductor substrate 501 on which constituent elements such as MOS transistors (not shown) were formed by a commonly well known method, a silicon carbonitride film 502 serving as a first insulation layer of a first conductor layer was formed by CVD in a thickness of 40 nm. This first insulation layer serves as an etch-stop film when a hole is formed for forming a wiring pattern.

Next, a spin-on film of a methyl isobutyl ketone solution composed chiefly of the hydrogen silsesquioxane compound was formed on the substrate, and thereafter heated at 100° C. for 10 minutes and then at 150° C. for 10 minutes and further at 230° C. for 10 minutes in an atmosphere of nitrogen by means of a hot plate. Then, the film was further heated at 350° C. for 30 minutes in an atmosphere of nitrogen by means of a furnace to form an insulation film in which Si—O—Si bond networks were formed in ladder structure and which was finally chiefly composed of SiO and in which nano-pores having distribution characteristics (diameter distribution) as shown in FIG. 3, chiefly containing pores of from 0.05 nm or more to 4 nm or less in diameter, were present, having dielectric constant of about 2.3. This film was formed in a thickness of 400 nm as a second insulation layer 503 of the first conductor layer.

Next, a silicon carbonitride film 504 serving as a third insulation layer of the first conductor layer was formed by CVD in a thickness of 40 nm. This film serves as a first insulation layer of a second conductor layer, and plays a role also as an etch-stop film or Cu-diffusion barrier film when a hole is formed for forming a wiring pattern.

Figure 5A:
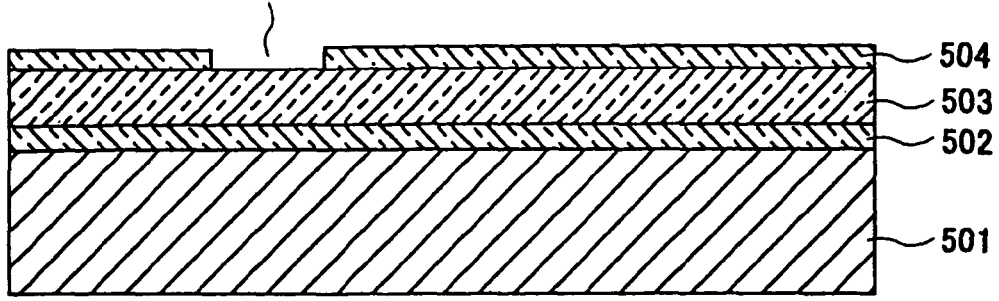
FIG. 5 is a flow sheet for illustrating how to produce a semiconductor device having a stacked structure according to Seventeenth Example.

Next, a hole 517 was formed in the silicon carbonitride film 504. The hole was formed using a photoresist and by forming a resist pattern by a known technique, followed by dry etching using the resist as a mask and using an etching gas capable of removing the silicon carbonitride film (FIG. 5A). Here, the hole is in a wiring size of the first conductor layer.

Next, in the same manner as the formation of the second insulation layer 503 of the first conductor layer, an insulation film 505 in which nano-pores having distribution characteristics as shown in FIG. 3, chiefly containing pores of from 0.05 nm or more to 4 nm or less in diameter, were present, having dielectric constant of about 2.3, which serves as a second insulation layer of the second conductor layer was formed in a thickness of 400 nm; and a silicon carbonitride film 506 serving as a third insulation layer in a thickness of 40 nm.

Figure 5B:
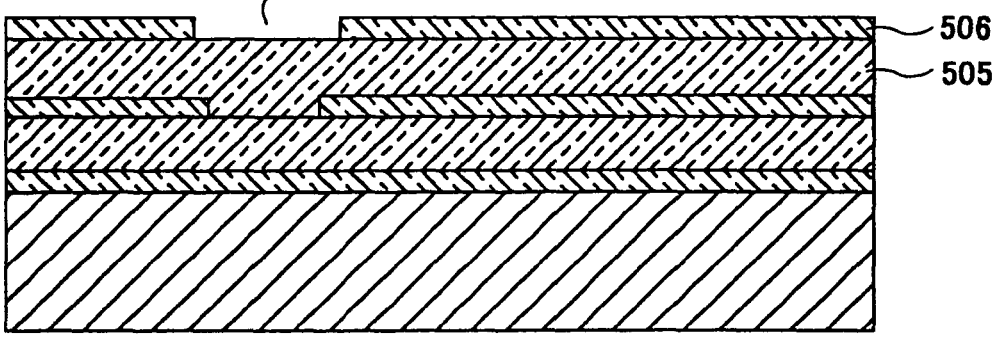

Next, a hole 518 was formed in the silicon carbonitride film 506 (FIG. 5B). The hole was formed using a photoresist and by forming a resist pattern by a known technique, followed by dry etching using the resist as a mask and using an etching gas capable of removing the silicon carbonitride film.

Next, using the silicon carbonitride film 506 as a mask, a hole was formed in the insulation film 505 by dry etching using a gas capable of removing the silicon oxide film. Thus, at its lower part, the insulation film 503 was uncovered through the hole 517 of the silicon carbonitride film 504.

Figure 5C:
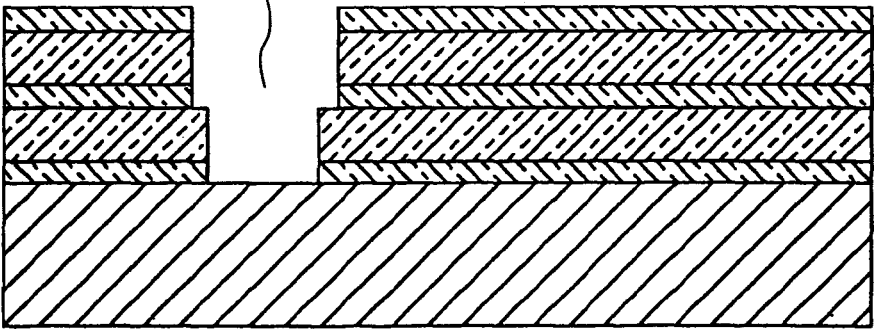

Subsequently, using the silicon carbonitride film 504 as a mask, a hole was formed in the silicon oxide film 503 through the former's hole 517. Thus, at its lower part, the silicon carbonitride film 502 was uncovered. Subsequently, the etching gas was changed for one capable of removing the silicon carbonitride film 502, and then, using the silicon oxide film 503 as a mask, the silicon carbonitride film 502 was removed by dry etching through the former's hole to form a hole extending therethrough to reach the semiconductor substrate 501. Here, the periphery of the hole 517 of the silicon carbonitride film 504 was also etched to make the hole 517 expand to the same size as the hole 518 of the uppermost silicon carbonitride film 506. Thus, a wiring trench 519 was formed which extended through the layers to reach the semiconductor substrate 501 (FIG. 5C).

Next, a barrier metal layer 520 was formed on the inner surfaces of the wiring trench 519, and thereafter the wiring trench 519 was filled with Cu 521 by well known plating. As the barrier metal, TiN was used in this Example.

Figure 5D:
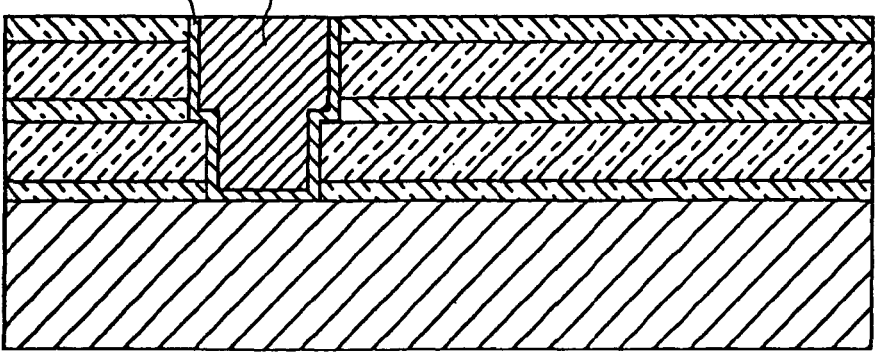

Then, any unnecessary Cu film present on the uppermost silicon carbonitride film 506 was removed by chemical mechanical polishing and the surface was cleaned to form a connecting plug and a wiring simultaneously. In this polishing step, the uppermost silicon carbonitride film 506 was not removed by the polishing to leave it. Thus, a dual-damascene structure in which a Cu wiring (inclusive of 520 and 521) was formed was produced. (FIG. 5D)

Thus, a high-performance semiconductor device was obtained the dielectric constant of the whole of interconnecting insulation layers of which was lowered in virtue of the use of the low-dielectric-constant film as the second insulation layer 503, which is the chief constituent layer of the interconnecting insulation layers.

In the construction of this Example, the device has a structure wherein the conductor layers are stacked in two layers. The conductor layers may twice or more repeatedly be stacked to obtain a semiconductor device having multi-layer wiring structure.

Eighteenth Example

In this Example, in the same manner as in Seventeenth Example, an SiO insulation film in which nano-pores having distribution characteristics as shown in FIG. 4, chiefly containing pores of from 0.05 nm or more to 1 nm or less in diameter, were present, having dielectric constant of about 2.7, was formed in respect of the second insulation layer 503 of the second conductor to produce a dual-damascene structure in which a Cu wiring was formed.

Thus, a high-performance semiconductor device was obtained the dielectric constant of the whole of interconnecting insulation layers of which was lowered in virtue of the use of the low-dielectric-constant film in respect of the second insulation layer 503, which is the chief constituent layer of the interconnecting insulation layers. The conductor layers may further twice or more repeatedly be stacked, whereby a high-performance semiconductor device having multi-layer wiring structure can be obtained with ease.

Nineteenth Example

Figure 6:
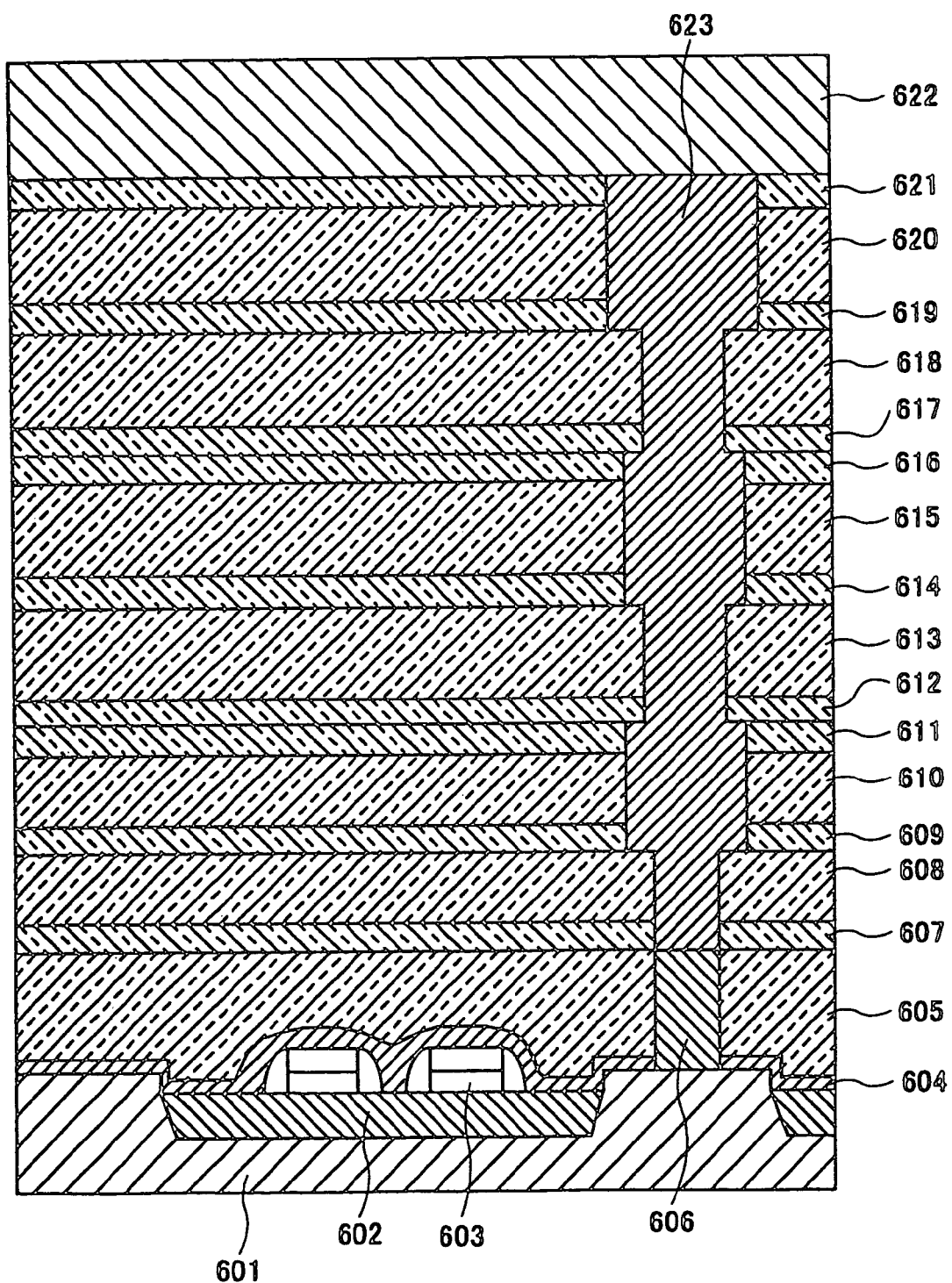
FIG. 6 is a cross-sectional view for illustrating a logic semiconductor device created in Nineteenth Example.

FIG. 6 is a cross-sectional view of a logic semiconductor device. On a semiconductor substrate 601, an element isolation region 602 was formed by known STI (shallow trench isolation), and MOS transistors 603 were formed in this element isolation region 602 (The hatching of a transistor is omitted for a figure to be looked easily). Then, a silicon oxide film 604 of about 50 nm thick and a BPSG (boron-phosphorus-silicate glass) film 605 of about 500 nm thick were formed by known CVD in order on the surface of the semiconductor substrate 601 inclusive of the MOS transistors 603, followed by reflow annealing in, e.g., an atmosphere of nitrogen of 800° C. to 900° C.

Next, the surface of the BPSG film 605 was polished to make flat by chemical mechanical polishing (CMP), and thereafter a contact hole was formed. In this contact hole, a conducting plug 606 was formed. Here, any unnecessary tungsten present on the surface of the BPSG film 605 has been removed by known etchback processing.

Next, in the same manner as in Seventeenth Example, a silicon carbonitride film 607 serving as a first insulation layer of a first conductor layer. This first insulation layer serves as an etch-stop film when a hole is formed for forming a wiring pattern.

Next, a spin-on film of a methyl isobutyl ketone solution composed chiefly of the hydrogen silsesquioxane compound was formed on the substrate, and thereafter heated at 100° C. for 10 minutes and then at 150° C. for 10 minutes and further at 230° C. for 10 minutes in an atmosphere of nitrogen by means of a hot plate. Then, the film was further heated at 350° C. for 30 minutes in an atmosphere of nitrogen by means of a furnace to form an insulation film in which Si—O—Si bond networks were formed in ladder structure and which was finally chiefly composed of SiO and in which nano-pores having distribution characteristics as shown in FIG. 3, chiefly containing pores of from 0.05 nm or more to 4 nm or less in diameter, were pre sent, having dielectric constant of about 2.3. This film was formed in a thickness of 400 nm as a second insulation layer 608 of the first conductor layer.

Next, a silicon carbonitride film 609 serving as a third insulation layer of the first conductor layer was formed by CVD in a thickness of 40 nm. This film serves as a first insulation layer of a second conductor layer, and plays a role also as an etch-stop film or Cu-diffusion barrier film when a hole is formed for forming a wiring pattern.

Next, a hole was formed in the silicon carbonitride film 609. The hole was formed using a photoresist and by forming a resist pattern by a known technique, followed by dry etching using the resist as a mask and using an etching gas capable of removing the silicon carbonitride film. Here, the hole is in a wiring size of the first conductor layer.

Next, in the same manner as the formation of the second insulation layer 608 of the first conductor layer, a second insulation layer 610 of a second insulation layer was formed in a thickness of 400 nm; and a silicon carbonitride film 611 serving as a third insulation layer in a thickness of 40 nm.

Next, a hole was formed in the silicon carbonitride film 611. Then, using this silicon carbonitride film 611 as a mask, a hole was formed in the insulation film 610 by dry etching using a gas capable of removing the silicon oxide film. Thus, at its lower part, the insulation film 609 was uncovered.

Subsequently, using the silicon carbonitride film 609 as a mask, a hole was formed in the silicon oxide film 608 through the former's hole. Then, the etching gas was changed for one capable of removing the silicon carbonitride film 607, and, using the silicon oxide film 608 as a mask, the silicon carbonitride film 607 was removed by dry etching through the former's hole to form a hole extending therethrough to reach the conducting plug 606. Here, the periphery of the hole of the silicon carbonitride film 609 was also etched to make this hole expand to the same size as the hole of the uppermost silicon carbonitride film 611.

Thus, a wiring trench was formed which extended through the layers to reach the conducting plug 606.

Next, a barrier metal layer was formed on the inner surfaces of the wiring trench, and thereafter the wiring trench was filled with Cu by well known plating. As the barrier metal, TiN was used in this Example. Then, any unnecessary Cu film present on the uppermost silicon carbonitride film 611 was removed by chemical mechanical polishing and the surface was cleaned to form a connecting plug and a wiring simultaneously. In this polishing step, the uppermost silicon carbonitride film 611 was not removed by the polishing to leave it. Thus, a dual-damascene structure in which a Cu wiring (inclusive of 520 and 521) was formed was produced.

The above steps were repeated to form a four-layer wiring structure (607, 608, 609, 610, 611, 612, 613, 614, 615, 616).

Subsequently, the like steps were repeated to further stack a two-layer wiring structure. Here, insulation layers 617, 619 and 621 were formed using silicon carbonitride films in a thickness of 40 nm each. Insulation layers 618 and 620 were also formed using silicon carbonitride films in a thickness of 600 nm each. Next, a silicon nitride film 622 was formed as the uppermost layer to produce a multi-layer wiring semiconductor device made up of a six-layer Cu wiring 623.

Thus, a high-performance semiconductor device was obtained the dielectric constant of the whole of interconnecting insulation layers of which was lowered in virtue of the use of, as the etch-stop films or Cu-diffusion barrier films, the silicon carbonitride films having lower dielectric constant than silicon nitride films, in virtue of the use of, in the lower-layer part of the multi-layer stacked structure, as the second insulation layers the insulation films having dielectric constant of less than 2.5 and superior film strength and also in virtue of the use of, in the upper-layer part of the multi-layer stacked structure, the fluorine-doped silicon oxide films having smaller dielectric constant than silicon oxide films.

Twentieth Example

Figure 7:
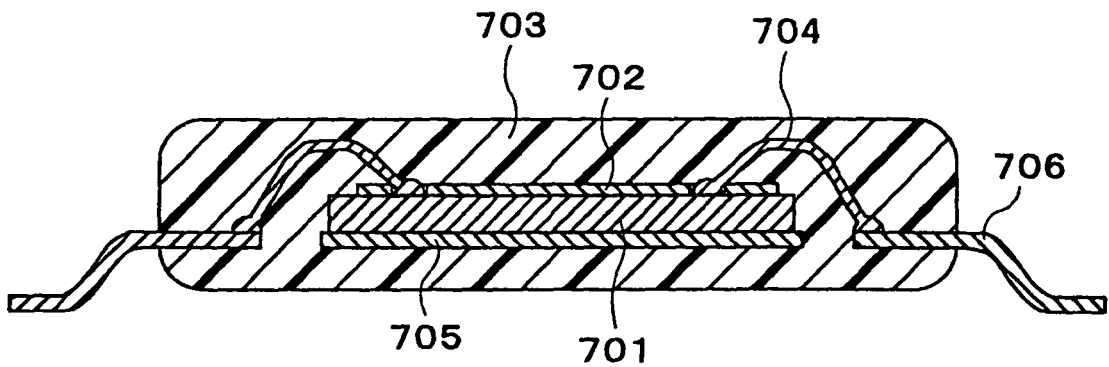
FIG. 7 is a cross-sectional view for illustrating a resin-encapsulated semiconductor device according to Twentieth Example.

FIG. 7 is a cross-sectional view of a resin-encapsulated logic semiconductor device which is Twentieth Example of the present invention.

A logic semiconductor device 701 obtained in Nineteenth Example and held in the state that a polyimide surface protective film 702 was formed except the part of bonding pads was fastened to a lead frame in the step of die-bonding.

Thereafter, gold wires 704 were attached from chip's bonding pads to outer leads 706 of the lead frame by means of a wire bonder.

Next, using a silica-containing biphenyl epoxy type molding resin material, resin encapsulation 703 was so formed as to envelope the logic semiconductor device 701, the outer leads 706 and so forth. The encapsulation was carried out under conditions of a molding temperature of 180° C. and a molding pressure of 70 kg/cm2, but not limited thereto.

Finally, the outer leads 706 are bent in a given shape to obtain a finished product of the resin-encapsulated logic semiconductor device.

The insulation films having small dielectric constant but well having kept the mechanical strength from lowering are used in a part of the interconnecting insulation layers of the resin-encapsulated logic semiconductor device. Hence, a resin-encapsulated product can be obtained without causing any cracks in the interior of the device during resin encapsulation processing, against the stress applied to the logic semiconductor device.

Needless to say that the same effect as that stated in Nineteenth Example can be exhibited as characteristics of the logic semiconductor device, the further encapsulation with resin enables the device to ensure electric performance and reliability from environment.

Twenty-First Example

Figure 8:
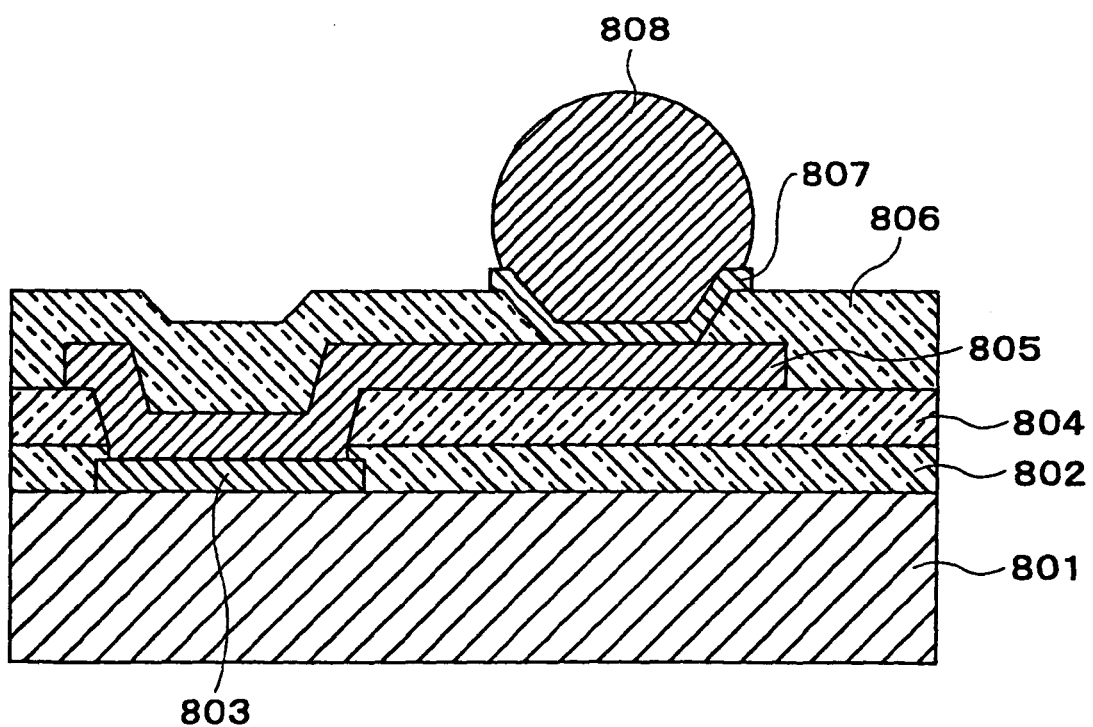
FIG. 8 is a cross-sectional view for illustrating a wafer level chip-size-packaging semiconductor device according to Twenty-first Example.

FIG. 8 is a cross-sectional view for illustrating Twenty-first Example, which is a case in which the logic semiconductor device described in Nineteenth Example is used in wafer level chip-size-packaging products.

On the uppermost layer, silicon nitride film 802 of a logic semiconductor device 801, a polyimide insulation film 804 is formed in such a shape that bonding pads 803 stand uncovered.

Next, electrical rewiring interconnection (between the die pad and the solder ball) 805 is formed. In this Example, the electrical rewiring interconnection 805 is one consisting of TiN, Cu and Ni three layers formed by sputtering, where, after their film formation, a wiring pattern has been formed by known photolithography technology.

A polyimide insulation film 806 is further formed thereon. Extending through this polyimide insulation film 806, underbump metal layers 807 are provided which are to make electrical connection in some region of the electrical rewiring interconnection 805. As the under-bump metal layers 807, three layers of Cr, Ni and Au are formed. Solder balls 808 are formed on the under-bump metal layers 807.

High-speed drivable logic semiconductor devices themselves can be formed on wafers by the method described in Nineteenth Example. Hence, this Example enables materialization of a logic semiconductor packaging device having solder balls in the state of a wafer.

The use of the interconnecting insulation layers having low dielectric constant has already afforded logic semiconductor devices having higher performance than conventional products. However, when packaged semiconductor products are surface-mounted on printed wiring boards (PWBs), the use of the packaged structure as in this Example enables high-speed performance of signal transmission between devices and printed wiring boards and enables further development of the performance of the logic semiconductor device.

Twenty-Second Example

Figure 9A:
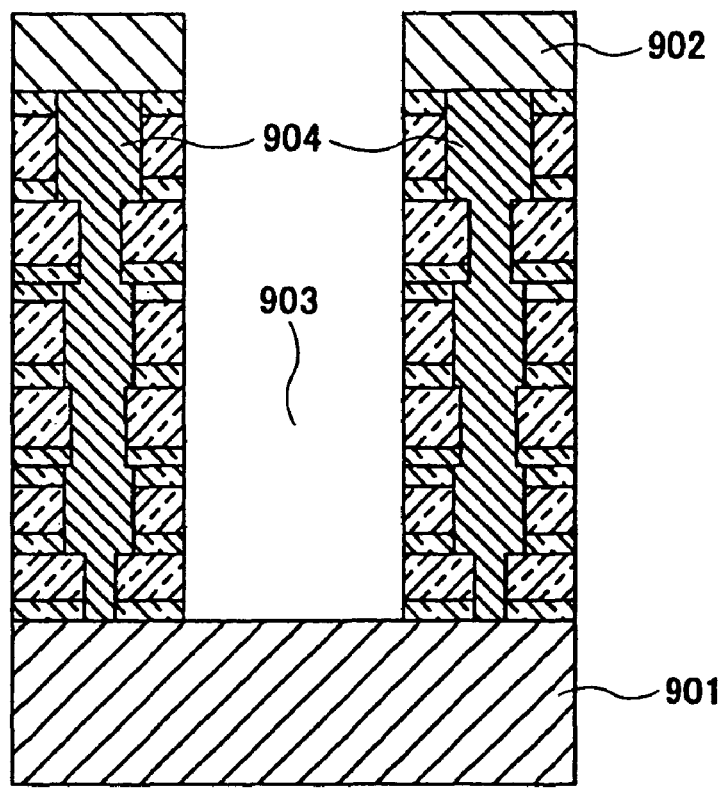
FIGS. 9A and 9B are a cross-sectional view and a plan view, respectively, for illustrating a semiconductor device having a guard ring structure according to Twenty-second Example.
Figure 9B:
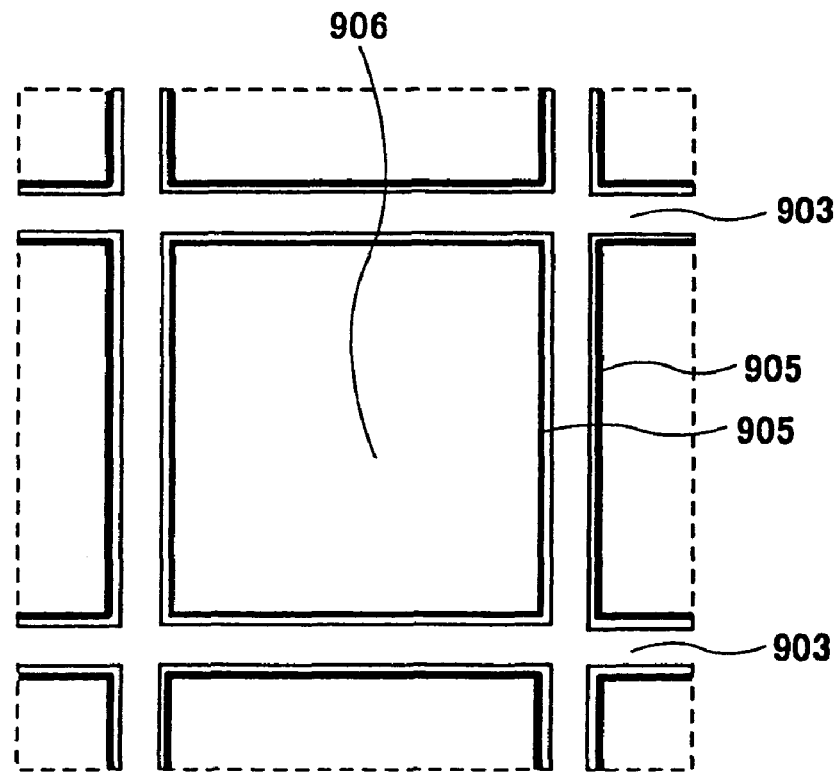

FIGS. 9A and 9B are a cross-sectional view (FIG. 9A) and a plan view (FIG. 9B) for illustrating Twenty-second Example.

On a silicon substrate 901, semiconductor devices 906 (such as MOS transistors) and semiconductor circuits (906) containing the se devices have been formed. On this substrate 901, the conductor layers described above have been formed. On the top layer of the device, a film 902 is formed. Then, using a material comprised of conductor wiring constituting the conductor layers, guard ring layers 904 are so provided as to surround the semiconductor devices 906 and enclose the periphery 905 of the semiconductor circuits (906) containing these devices. The semiconductor devices are divided from one another along lines 903. These guard ring layers 904 are provided for the purpose of preventing water content from entering the semiconductor devices 906 and the semiconductor circuits (906) containing these devices, which have been separated from the silicon substrate along lines 903. These are formed in the step of forming the conductor wiring.

Thus, especially when the insulation films having nanopores are used as the interconnecting insulation layers showing characteristics of low dielectric constant, a semiconductor device can be provided which has solved the problems of permeation, or adsorption, of the water content in the interiors of, or on the inner walls of, the pores, and has been improved in moisture resistance reliability of the semiconductor device itself.

In the above, the present invention has been described in detail giving Examples. Conditions and so forth for accomplishing the present invention and Examples are by no means limited to those of these Examples.

As having been described above, in the semiconductor device having multi-layer stacked wirings employing the damascene structure where copper wirings made to have low wiring resistance are buried in interconnecting insulation layers, films having smaller dielectric constant than silicon nitride films are used as etch-stop films or Cu-diffusion barrier films, and also the insulation films in the lower-layer part and upper-layer part of the multi-layer stacked structure are made different. Thus, the high-performance semiconductor device can be obtained which has made the whole device have high mechanical strength and has made the whole of interconnecting insulation layers have low dielectric constant.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications a fall within the ambit of the appended claims.

What is claimed is:

1. A semiconductor device comprising:
a semiconductor substrate;
MOS transistors formed on said semiconductor substrate;
a plurality layers of wiring structure positioned over said MOS transistors and each wiring structure comprising a first insulating film, a second insulating film formed over said first insulating film, a first wiring layer formed in said first insulating film, and a second wiring layer comprising copper material, formed in said second insulating film; and
a rewiring interconnection positioned over said plurality layers of wiring structure, having an outer lead connection in a part thereof;
wherein an uppermost wiring structure among said plurality layers of said wiring structure has a third insulating film formed between said first insulating film and said second insulating film of said uppermost wiring structure, having a dielectric constant higher than a dielectric constant of said second insulating film of said uppermost wiring structure,
said outer lead connection is positioned over said second insulating film of said uppermost wiring structure in cross-sectional view, and
said second insulating film of a lowermost wiring structure has lower dielectric constant than that of said second insulating film of said uppermost wiring structure.

2. A semiconductor device according to claim 1, wherein said second insulating film of said uppermost wiring structure is fluorine-doped silicon oxide.

3. A semiconductor device according to claim 1, wherein said second insulating film of said lowermost wiring structure has a dielectric constant of less than 2.5.

4. A semiconductor device according to claim 3, wherein said second insulating film of said lowermost wiring structure has nano-pores.

5. The semiconductor device according to claim 1, wherein
said lowermost wiring structure has a fourth insulating film formed over said second insulating film of said lowermost wiring structure;
said fourth insulating film has a dielectric constant higher than that of said second insulating film; and
said second wiring layer of said lowermost wiring structure is formed to extend through thickness direction of said second and fourth insulating films.

6. The semiconductor device according to claim 1, further comprising
a resin encapsulation which covers said semiconductor substrate;
outer lead having a part thereof exposed from said resin encapsulation, electrically connected to said outer lead connection.

7. The semiconductor device according to claim 1, further comprising
a fifth insulating film positioned between said uppermost wiring structure and said rewiring interconnection;
wherein said fifth insulating film comprises a polyimide insulation film.

8. A semiconductor device comprising:
a semiconductor substrate;
MOS transistors formed on said semiconductor substrate;
a plurality of layers of dual damascene wiring structure positioned over said MOS transistors and each dual damascene wiring structure comprising a first insulating film, a second insulating film formed over said first insulating film, a first copper wiring layer formed in said first insulating film, and a second copper wiring layer formed continuously with said first copper wiring layer in said second insulating film; and
a rewiring interconnection positioned over said plurality of dual damascene wiring structures, having an outer lead connection in a part thereof;
wherein an uppermost dual damascene wiring structure among said plurality of layers of said dual damascene wiring structures has a third insulating film formed between said first insulating film and said second insulating film of said uppermost dual damascene wiring structure, having a dielectric constant higher than a dielectric constant of said second insulating film of said uppermost dual damascene wiring structure;
said outer lead connection is positioned over said second insulating film of said uppermost dual damascene wiring structure in cross-sectional view, and
said second insulating film of a lowermost dual damascene wiring structure has a dielectric constant lower than a dielectric constant of said second insulating film of said uppermost dual damascene wiring structure.

9. The semiconductor device according to claim 8, wherein
said second insulating film of said uppermost dual damascene wiring structure is fluorine-doped silicon oxide.

10. The semiconductor device according to claim 8, wherein
said second insulating film of said lowermost dual damascene wiring structure has a dielectric constant of less than 2.5.

11. The semiconductor device according to claim 8, wherein
said second insulating film of said lowermost dual damascene wiring structure has nano-pores.

12. The semiconductor device according to claim 5, wherein
said uppermost wiring structure has a fifth insulating film formed over said second insulating film of said uppermost wiring structure;
said fifth insulating film has a dielectric constant higher than a dielectric constant of said second insulating film of said uppermost wiring structure; and
said second wiring layer of said uppermost wiring structure is formed to extend through the thickness direction of said second and fifth insulating films.

13. The semiconductor device according to claim 8, wherein
said lower most dual damascene wiring structure has a fourth insulating film formed over said second insulating film of said lower most dual damascene wiring structure;
said fourth insulating film has a dielectric constant higher than a dielectric constant of said second insulating film of said lower most dual damascene wiring structure; and
said second copper wiring layer of said uppermost dual damascene wiring structure is formed to extend through the thickness direction of said second and fourth insulating films.

14. The semiconductor device according to claim 13, wherein
said uppermost dual damascene wiring structure has a fifth insulating film formed over said second insulating film of said uppermost dual damascene wiring structure;
said fifth insulating film has a dielectric constant higher than a dielectric constant of said second insulating film of said uppermost dual damascene wiring structure; and
said second copper wiring layer of said uppermost dual damascene wiring structure is formed to extend through the thickness direction of said second and fifth insulating films.

* * * * *